United States Patent
Suh et al.

(10) Patent No.: US 8,049,410 B2
(45) Date of Patent: Nov. 1, 2011

(54) ORGANIC LIGHT EMITTING DISPLAY WITH A GROUND RING AND METHOD OF MANUFACTURING THE SAME

(75) Inventors: Misook Suh, Yongin-si (KR); Heyjin Shin, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 503 days.

(21) Appl. No.: 12/178,490

(22) Filed: Jul. 23, 2008

(65) Prior Publication Data

US 2009/0045733 A1 Feb. 19, 2009

(30) Foreign Application Priority Data

Aug. 14, 2007 (KR) .................. 10-2007-0081850

(51) Int. Cl.
- H05B 33/04 (2006.01)
- H01J 1/62 (2006.01)
- H01L 21/02 (2006.01)

(52) U.S. Cl. .......... 313/504; 313/500; 313/506; 257/79; 257/81; 257/86; 445/24

(58) Field of Classification Search .................. 312/505, 312/506

See application file for complete search history.

(56) References Cited

U.S. PATENT DOCUMENTS

| | | | |
|---|---|---|---|
| 2003/0094615 A1 * | 5/2003 | Yamazaki et al. | 257/72 |
| 2005/0104530 A1 * | 5/2005 | Chung et al. | 315/169.3 |
| 2006/0238463 A1 * | 10/2006 | Kim et al. | 345/80 |

FOREIGN PATENT DOCUMENTS

| | | |
|---|---|---|
| JP | 2001100233 A * | 4/2001 |
| JP | 2006-004907 A | 1/2006 |
| KR | 10-2003-0022470 | 3/2003 |
| KR | 10-2005-0050485 | 5/2005 |
| KR | 10-2006-0010354 | 2/2006 |
| KR | 10-2006-0055615 | 5/2006 |
| KR | 10-2006-0085491 | 7/2006 |

OTHER PUBLICATIONS

Machine English translation of JP 2001100233 to Kajima.*

* cited by examiner

*Primary Examiner* — Sikha Roy

(74) *Attorney, Agent, or Firm* — Christie, Parker & Hale, LLP

(57) ABSTRACT

An organic light emitting display including: a substrate having a center region; a pixel unit on the substrate and at the center region of the substrate; a non-pixel unit on the substrate and at an external circumference of the pixel unit; a ground ring in the non-pixel unit; a mother substrate wiring line on the substrate and at the external circumference of the ground ring; and a connection wiring line for electrically connecting the ground ring and the mother substrate wiring line to each other.

19 Claims, 10 Drawing Sheets

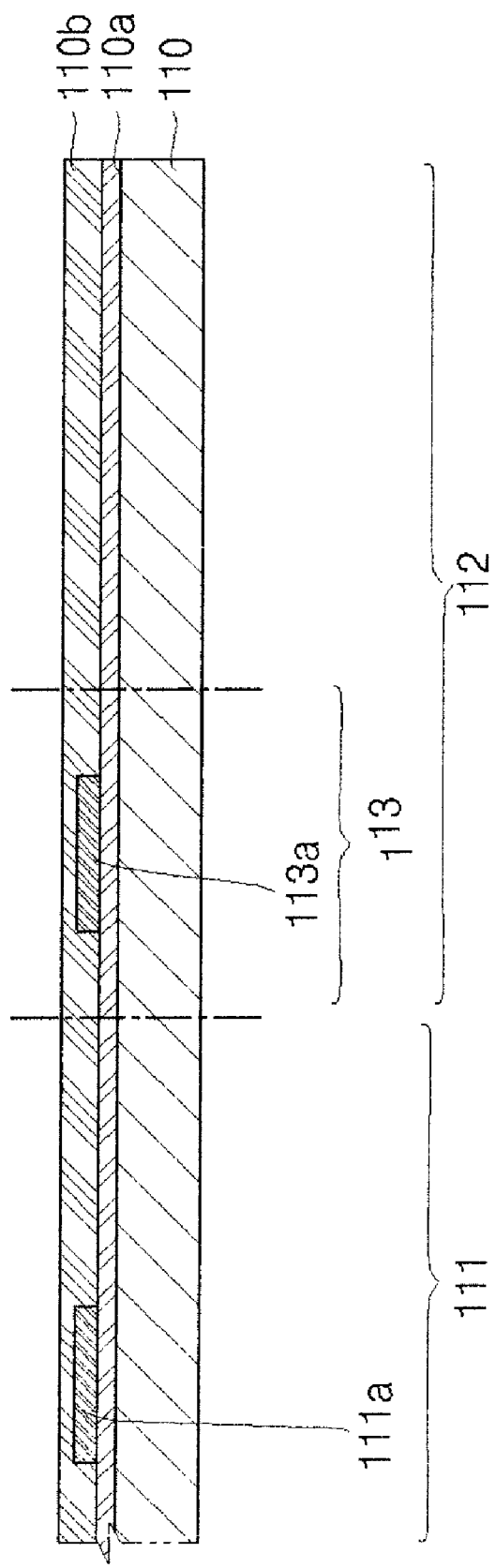

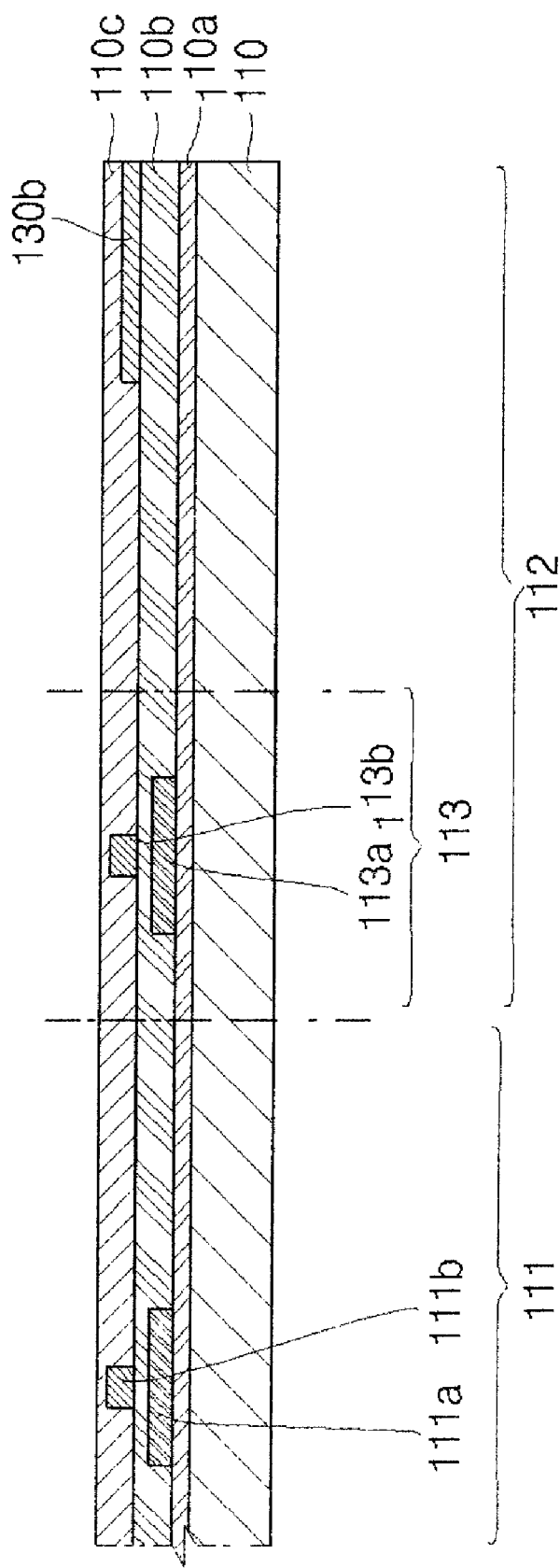

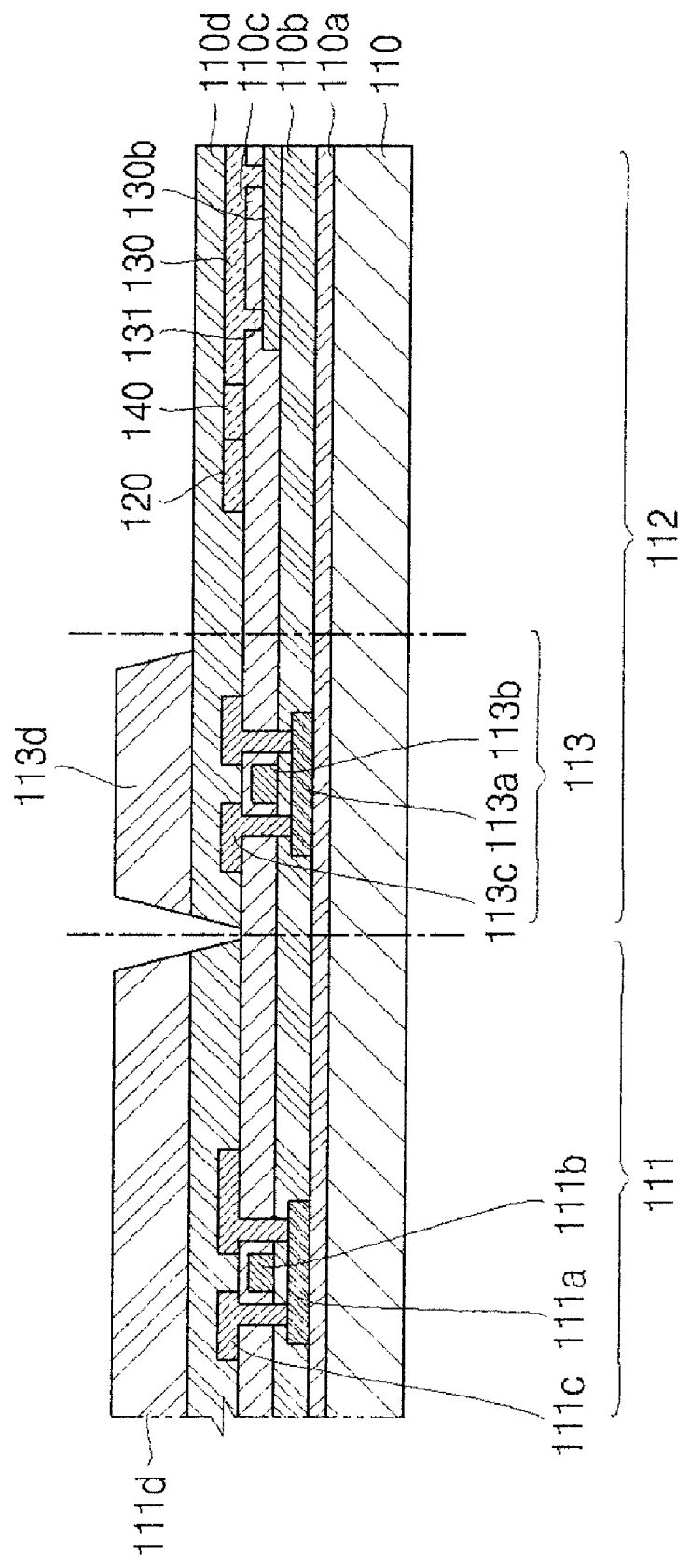

ORGANIC LIGHT EMITTING DISPLAY WITH A GROUND RING AND METHOD OF MANUFACTURING THE SAME

CROSS-REFERENCE TO RELATED APPLICATION

This application claims priority to and the benefit of Korean patent Application No. 10-2007-0081850, filed on Aug. 14, 2007, in the Korean Intellectual Property Office, the entire content of which is incorporated herein by reference.

BACKGROUND OF THE INVENTION

1. Field of the Invention

The present invention relates to an organic light emitting display and a method of manufacturing the same.

2. Description of Related Art

An organic light emitting display is a kind of flat panel display (FPD) that uses an organic light emitting diode (OLED) to generate light by re-combining electrons supplied by cathodes with holes supplied by anodes. The OLED is thin and has a wide view angle and high response speed.

The conventional organic light emitting display includes a pixel unit (or display region) including pixels arranged in a matrix, and a non-pixel unit (or non-display region) including a power source and a driving unit for driving the pixels. The pixels of the pixel unit include thin film transistors (TFTs) and the OLEDs required for driving or switching the pixels. The pixel unit and the non-pixel unit are electrically connected to each other by a plurality of lines.

The conventional organic light emitting display is manufactured by forming the TFTs and forming, encapsulating, and modulating the OLEDs. In the organic light emitting display, static electricity can be generated internally or externally from the manufacturing processes. That is, static electricity can be generated by most manufacturing processes including the deposition and etching processes during the manufacturing of the organic light emitting display or can be generated by the external environments while an image is displayed on the organic light emitting display.

Accordingly, the internal circuit of the organic light emitting display may be damaged by the electrostatic discharge (ESD) generated by manufacturing processes and external environments.

SUMMARY OF THE INVENTION

Accordingly, aspects of embodiments of the present invention are directed toward an organic light emitting display capable of inducing static electricity to be discharged and protecting pixels and a driving unit included in the organic light emitting display from being damaged by the discharge of static electricity and a method of manufacturing the same.

An embodiment of the present invention provides an organic light emitting display including: a substrate having a center region; a pixel unit on the substrate and at the center region of the substrate; a non-pixel unit on the substrate and at an external circumference of the pixel unit; a ground ring in the non-pixel unit; a mother substrate wiring line on the substrate and at the external circumference of the ground ring; and a connection wiring line for electrically connecting the ground ring and the mother substrate wiring line to each other.

The organic light emitting display may further include a protecting layer including $Si_3N_4$ on the ground ring and the mother substrate wiring line.

A buffer layer and a gate insulation layer may be sequentially on the substrate and in the non-pixel unit; a gate electrode may be on the gate insulation layer; an interlayer insulation layer may be on the gate electrode to cover the gate electrode, wherein the ground ring and the mother substrate wiring line may be on the gate electrode and the interlayer insulation layer; and wherein the ground ring and the mother substrate wiring line may be electrically connected to each other by the connection wiring line.

The organic light emitting display may further include a protecting layer including $Si_3N_4$ on the ground ring and the mother substrate wiring line.

The connection wiring line may include a same material as those of the ground ring and the mother substrate wiring line and may be on a same layer of the organic light emitting display as that of the ground ring and the mother substrate wiring line.

The mother substrate wiring line may be electrically connected to the gate electrode through a contact hole for forming a conductive contact.

The mother substrate wiring line may have a side exposed to the outside of the interlayer insulation layer and the protecting layer.

The ground ring may have a substantially square ring form to surround at least three sides of the pixel unit.

The mother substrate wiring line may be at one or more sides of an external circumference of the ground ring and extends in a column direction.

The non-pixel unit may include: a driving integrated circuit unit for driving pixels of the pixel unit; and a pad unit for electrically connecting the driving integrated circuit unit and the ground ring to an external module.

The ground ring may be electrically connected to a circuit unit ground line for outputting a ground signal of the driving integrated circuit unit.

The pad unit may be at one or more sides of an internal circumference of the substrate.

The ground ring may have ends electrically connected to a flexible printed circuit board.

The flexible printed circuit board may include: a power source supplying unit for supplying power to the pixel unit; a power source unit ground line for outputting a ground signal of the power source supplying unit; and a power source ground line electrically connected to the ground ring.

Another embodiment of the present invention provides a method of manufacturing an organic light emitting display including: preparing a substrate with a pixel unit formed at a center region of the substrate and a non-pixel unit formed at an external circumference of the pixel unit; forming a buffer layer on the substrate; forming a gate insulation layer on the buffer layer; forming a gate electrode on the gate insulation layer; forming an interlayer insulation layer on the gate electrode to cover the gate electrode; forming a ground ring and a mother substrate wiring line on the interlayer insulation layer and in the non-pixel unit; and forming a connection wiring line for electrically connecting the ground ring and the mother substrate wiring line to each other.

The connection wiring line may be made of a same material as those of the ground ring and the mother substrate wiring line and may be formed on a same layer as those of the ground ring and the mother substrate wiring line.

The mother substrate wiring line may be connected to the gate electrode through a contact hole for forming a conductive contact.

The forming of the ground ring and the mother substrate wiring line may include forming a protecting layer including $Si_3N_4$ on the ground ring and the mother substrate wiring line.

The preparing of the substrate may include forming at least one driving unit for driving a pixel of the pixel unit to emit light in the non-pixel unit.

An embodiment of the present invention provides an organic light emitting display including: a substrate; a pixel unit on the substrate; a non-pixel unit on the substrate and including a ground ring and a mother substrate wiring line; and a connection wiring line for electrically connecting the ground ring and the mother substrate wiring line to increase an area for discharging static electricity to ground.

BRIEF DESCRIPTION OF THE DRAWINGS

The accompanying drawings, together with the specification, illustrate exemplary embodiments of the present invention, and, together with the description, serve to explain the principles of the present invention.

FIGS. 5a, 5b, 5c, 5d, 5e, and 5f are sectional views of parts of the organic light emitting display illustrating the method of manufacturing the organic light emitting display according to the flowchart of FIG. 4.

DETAILED DESCRIPTION

Figure 1:
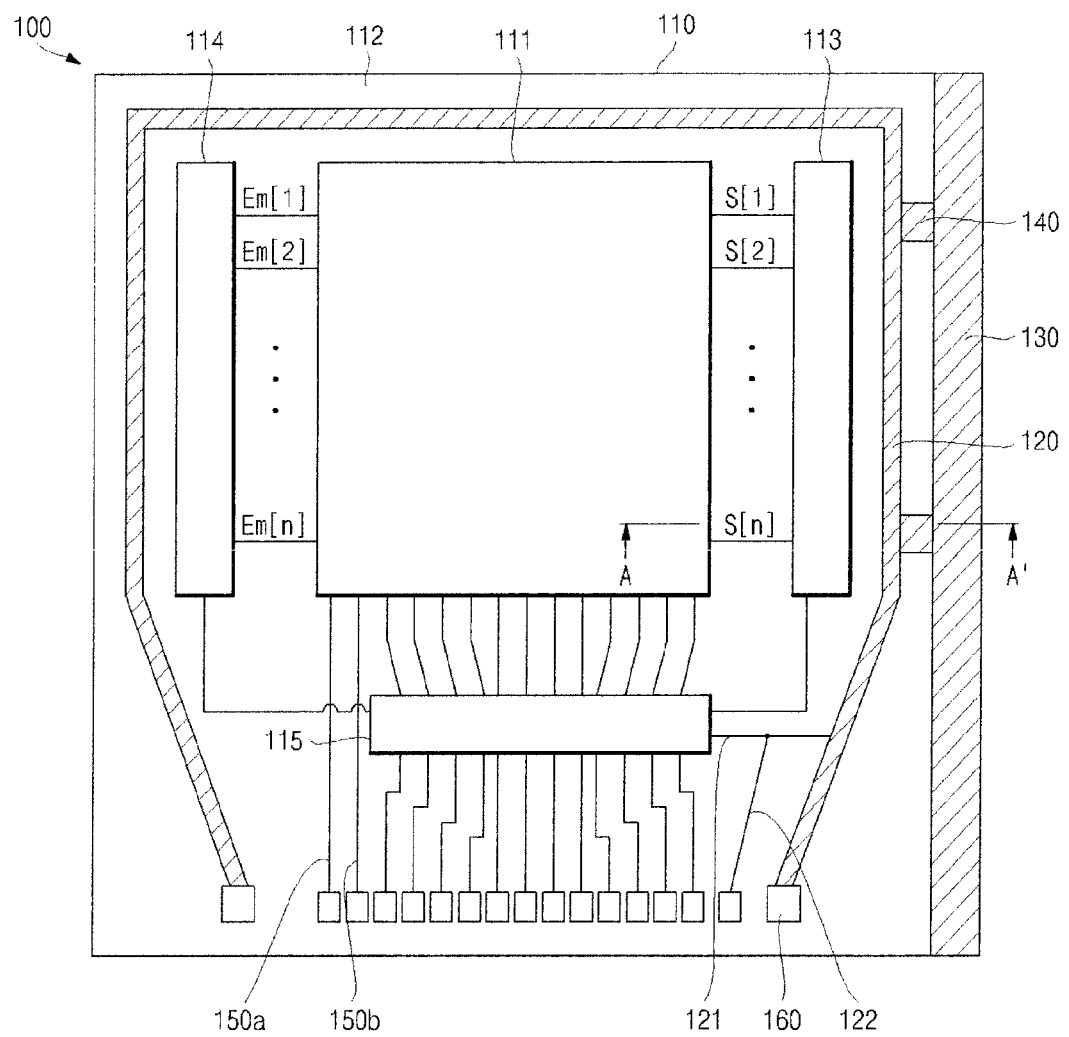
FIG. 1 is a plan view illustrating an organic light emitting display according to an embodiment of the present invention.

In general, a plurality of organic light emitting displays are formed on one mother substrate and are scribed so they can be separated from each other to form each of the organic light emitting displays. In this case, insulation between the conductive layers included in the TFTs may be broken by the static electricity so that a short is caused between the conductive layers. Therefore, components may erroneously operate due to the short to deteriorate the picture quality of the screen of the organic light emitting display that requires a high degree of uniformity.

In addition, when the mother substrate is inspected, mother substrate wiring lines are inserted in order to inspect whether the pixels are defective so that an external space is removed. Therefore, the width of a ground ring is reduced due to limitation on the space that is caused by the arrangement of the mother substrate wiring lines so that the organic light emitting display is vulnerable to static electricity. As such, the OLEDs may also be damaged and broken by this type of static electricity.

In the following detailed description, only certain exemplary embodiments of the present invention are shown and described, by way of illustration. As those skilled in the art would recognize, the invention may be embodied in many different forms and should not be construed as being limited to the embodiments set forth herein.

Also, in the context of the present application, when a unit or element is referred to as being "on" another unit or element, it can be directly on the another unit or element or be indirectly on the another unit or element with one or more intervening units or elements interposed therebetween. In addition, when a unit or element is electrically connected to another unit or element, it can be directly connected to the another unit or element or be indirectly connected to the another unit or element with one or more intervening units or elements interposed therebetween. Like reference numerals designate like elements throughout the specification.

FIG. 1 is a plan view illustrating an organic light emitting display according to an embodiment of the present invention.

Referring to FIG. 1, an organic light emitting display 100 according to an embodiment of the present invention includes a substrate 110 on which a pixel unit (or display region) 111 is formed at (or in) the center region of the substrate 110 and a non-pixel unit 112 (non-display region) is formed at the external circumference of the pixel unit 111; a ground ring 120 formed in the non-pixel unit 112; a mother substrate wiring line 130 formed at the external circumference (e.g., at one or more edges) of the ground ring 120; and connection wiring lines 140 for electrically connecting the ground ring 120 and the mother substrate wiring line 130 to each other.

On the substrate 110, the pixel unit 111 is substantially square in shape (or is a substantially square pixel unit), includes a plurality of pixels including organic light emitting diodes (OLED), and is at (or in) the center region of the substrate 110. For the pixel unit 111, a scan driver 113 for supplying scan signals, a light emission control driver 114 for supplying light emission control signals, and a driving integrated circuit unit 115 for driving the pixels can be electrically connected to each other. Here, the scan driver 113 and the light emission control driver 114 are electrically connected to the driving integrated circuit unit 115 to receive control signals from the driving integrated circuit unit 115, to supply the received control signals to the pixel unit 111, and to display an image. In addition, the pixel unit 111 is electrically connected to a first power source line 150a and a second power source line 150b for inputting and outputting a power source to and from the outside of the pixel unit 111. The pixel unit 111 receives the scan signals, the light emission control driving signals, the data control signals, and a first power ELVDD and a second power ELVSS that are supplied thereto to display an image.

The scan driver 113 sequentially supplies the scan signals to the pixel unit 111 through a plurality of scan lines S[1], S[2], . . . , and S[n]. Therefore, the scan driving unit 113 is electrically connected to the driving integrated circuit unit 115 in order to receive the control signals from the driving integrated circuit unit 115. The scan driving unit 113 receives the scan control signals and the power source voltage that are supplied from the driving integrated circuit unit 115 to generate the scan signals and to supply the generated scan signals to the pixel unit 111.

The light emission control driver 114 sequentially supplies the light emission control driving signals to the pixel unit 111 through a plurality of light emission control lines Em[1], Em[2], . . . , and Em[n]. The pixels connected to the light emission control lines Em[1], Em[2], . . . , and Em[n] receive the light emission control driving signals to determine the point of time at which generated current flows to the OLEDs. Therefore, the light emission control driving unit 114 is electrically connected to the driving integrated circuit unit 115 to receive the control signals from the driving integrated circuit unit 115. The light emission control driving unit 114 receives the light emission control driving signals and the power source voltage that are supplied from the driving integrated circuit unit 115 to generate the light emission control signals and to supply the generated light emission control signals to the pixel unit 111.

The driving integrated circuit unit 115 receives the data signals and power (e.g., a power source voltage) from an external apparatus to generate the data control signals. The data control signals generated by the driving integrated circuit unit 115 are supplied to the pixel unit 111. Here, the driving integrated circuit unit 115 is electrically connected to the scan driver 113 and the light emission control driver 114 to supply the control signals. Also, for the driving integrated circuit unit 115, a plurality of signal lines for connecting the driving integrated circuit unit 115 to the external apparatus are electrically connected to pad units 160, respectively. In addition, the driving integrated circuit unit 115 includes a circuit unit ground line 121 for outputting ground signals. In addition, the circuit unit ground line 121 includes a power source unit ground line 122 for outputting the ground signals from the external apparatus. Here, the circuit unit ground line 121 and the power source unit ground line 122 are electrically connected to each other so that a digital ground and an analog ground can be used together or in common.

A data driver and a controller are built in the driving integrated circuit unit 115. The data driver supplies data current to the corresponding data line so that a data signal is supplied to the pixel of the corresponding horizontal line when the scan signals are supplied to the scan lines S[1], S[2], . . . , and S[n]. The data driver can be realized by the driving integrated circuit unit 115 in accordance with the data control signals. Therefore, the organic light emitting display 100 according to the present embodiment receives the uniform data current output by a plurality of driving chips in the data driver to display an image of uniform picture quality.

The ground ring 120 can be formed to have a substantially square shape (or to be a substantially square ground ring 120) that surrounds at least three sides of the substantially square pixel unit 111. The circuit unit ground line 121 for outputting the ground signals of the driving integrated circuit unit 115 and the power source ground line 122 for outputting power source ground from the external apparatus can be electrically connected to the ground ring 120 in common (or can be electrically connected together to the ground ring 120). That is, the ground ring 120 receives digital ground signals from the circuit unit ground line 121 and receives analog ground signals from the power source unit ground line 122 to simultaneously or currently utilize the digital ground signals and the analog ground signals at the same time (or substantially the same time).

Here, the pad units 160 are electrically connected to the external apparatus in order to supply the power source signals supplied from the outside to the pixel unit 111. That is, the first power source line 150a and the second power source line 150b for supplying the power to the pixel unit 111 are electrically connected to the external apparatus. In addition, the pad units 160 are formed in (or at) the ends of the plurality of signal wiring lines of the driving integrated circuit unit 115 and the ground ring 120 and are connected to the external apparatus that supplies the signals and the power. That is, the pad units 160 are used as signal lines that drive the pixels. Therefore, wiring lines for inspecting the mother substrate and wiring lines for driving a panel are not separately formed so that the space is not wasted.

The mother substrate wiring line 130 is formed on at least one side of the external circumference of the ground ring 120 in a column direction. Here, in one embodiment, the mother substrate wiring line 130 is cut and floated after being scribed during the inspection of the mother substrate so that electrostatic discharge (ESD) may be received. In addition, since the mother substrate wiring line 130 reduces the spatial margin of the external region of the pixels, the width of the ground ring 120 is reduced so that the organic light emitting display 100 is vulnerable to this type of static electricity. Therefore, in one embodiment, the mother substrate wiring line 130 is electrically connected to the ground ring 120.

The organic light emitting display 100 includes the connection wiring lines 140 for electrically connecting the ground ring 120 and the mother substrate wiring line 130 to each other. The ground ring 120 and the mother substrate wiring line 130 can be formed in the same layer of the same (or substantially the same) material of the connection wiring lines 140. Therefore, the ground ring 120 and the mother substrate wiring line 130 are electrically connected to each other to increase the width of the ground ring 120 and to thus improve the reliability of the ESD.

That is, the organic light emitting display 100 can be aged and the picture quality of the organic light emitting display 100 can be evaluated before producing the organic light emitting display 100. In general, during the aging process, the organic light emitting display is aged to some degree immediately after a semiconductor product is manufactured in order to test the reliability of the product so that a user is not burdened by the generation of a defective product at an early stage. The aging process includes transistor (TR) aging in which a transistor is aged and forward aging and reverse aging in which an OLED is aged. In the forward aging, forward current is applied to the OLED so that the organic light emitting display is aged. In the reverse aging, reverse current is applied to the OLED so that the life and efficiency of the OLED are improved.

Also, when the picture quality of the organic light emitting display is evaluated, testing power sources and signals should be received. Therefore, in order to evaluate the picture quality of the organic light emitting display in units of the plurality of pixels, the testing power source lines and signal lines connected to the pixels should be properly arranged. However, as the power source lines and the signal lines increase, the power source lines and the signal lines cannot be designed to be too wide. Hence, a voltage IR drops, signals RC delays, and the ESD can occur (or generate).

During the evaluation of the picture quality, the same (or substantially the same) data voltage is input to the mother substrate so that it is determined whether the organic light emitting display is defective or not. During the evaluation of the picture quality, the mother substrate wiring line 130 can be inserted in order to determine whether the pixels are defective or not. Here, a spatial margin is lacking in the external region of cells. In addition, since the mother substrate is floated after being scribed in units of cells so that charge may not be discharged to the external power source or ground, the mother substrate wiring line 130 according to one embodiment is electrically connected to the ground ring 120 to prevent (or protect) the organic light emitting display panel from being defective. In addition, the mother substrate wiring line 130 is connected to the ground ring 120 so that the mother substrate wiring line 130 plays the same role as the ground ring 120 and that the width of the ground ring 120 is increased to improve the reliability of the ESD.

Figure 2:
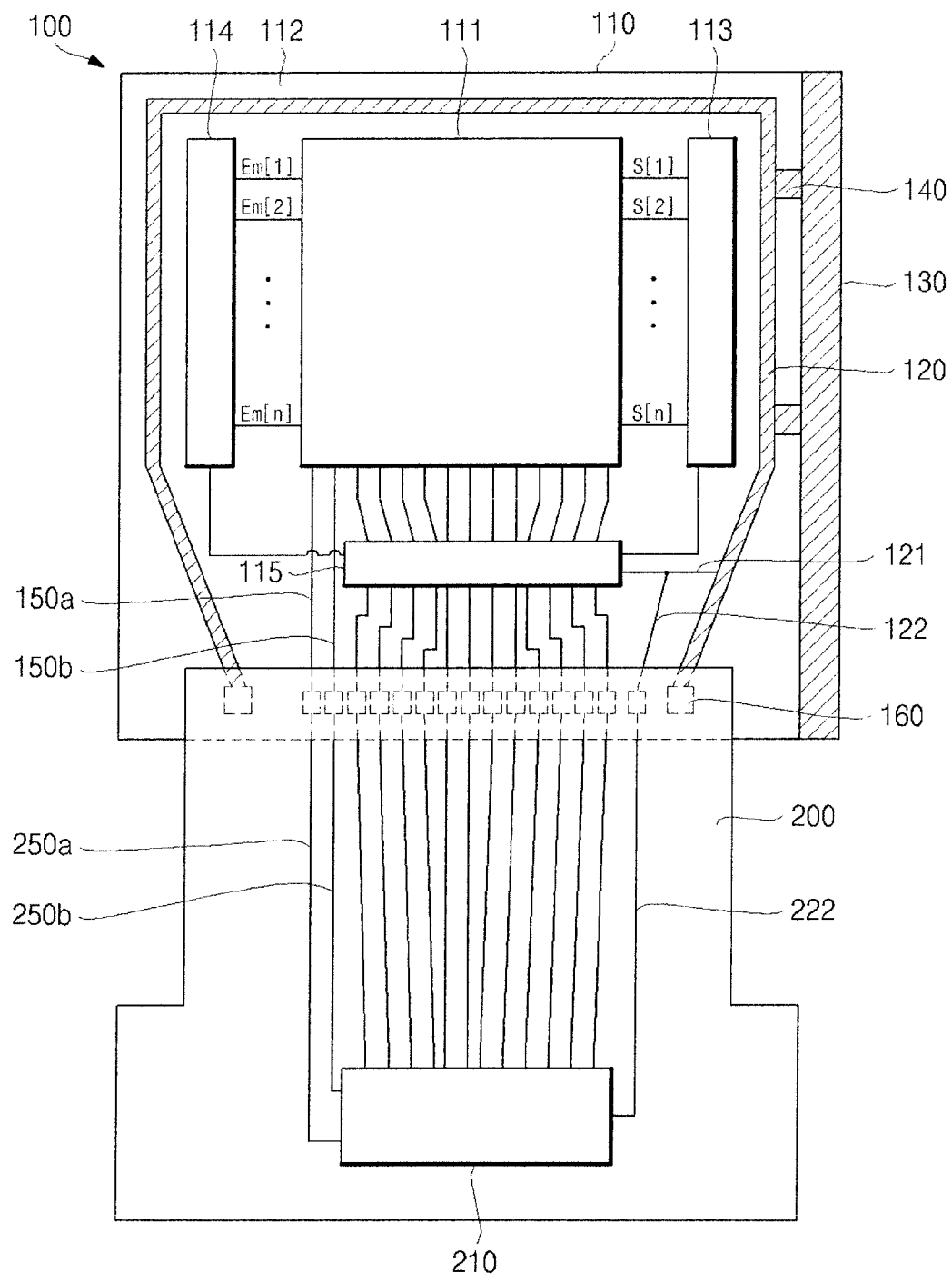
FIG. 2 is a plan view illustrating the organic light emitting display of FIG. 1 combined with a flexible printed circuit board (FPC) according to an embodiment of the present invention.

FIG. 2 is a plan view illustrating the organic light emitting display 100 combined with a flexible printed circuit board (FPC) according to an embodiment of the present invention.

Referring to FIG. 2, since the structure of the organic light emitting display 100 is the same as the structure of the organic light emitting display 100 of FIG. 1, detailed description thereof is not provided again in order to avoid redundancy.

Here, the scan driver 113, the light emission control driver 114, and the driving integrated circuit unit 115 of the organic light emitting display 100 can be directly mounted on the substrate 110 where the pixel unit 111 is formed and can be replaced by a driving circuit formed of the same layers as the scan lines S[1], S[2], ..., and S[n], the light emission control lines Em[1], Em[2], ..., and Em[n], and the transistor(s) on the substrate 110 where the pixel unit 111 is formed.

In addition, the scan driver 113, the light emission control driver 114, and the driving integrated circuit unit 115 can have a chip on flexible board or chip on film (COF) structure. In other words, the scan driver 113, the light emission control driver 114, and the driving integrated circuit unit 115 can be mounted on the substrate in the form of a chip like the flexible printed circuits (FPC) 200 or be films that are attached to and electrically connected to the substrate. Here, the FPC 200 is a circuit board in which a circuit (or complicated circuit) is formed on a flexible film of a heat resistant plastic film such as polyester (PET) or polyimide (PI). As such, space can be effectively used, and the wiring lines can be three dimensionally provided in a video camera, a car stereo, and the heads of a computer and a printer due to flexibility such as bending, overlapping, folding, rolling, and twisting.

The FPC 200 includes a power source supplying unit 210 for supplying a power source to the pixel unit 111. The power source supplying unit 210 includes a first power source supplying line 250a and a second power source supplying line 250b for supplying power, and a power source supplying unit ground line 222 for inputting the ground signal(s). The power source supplying unit ground line 222 is electrically connected to one of the pad units 160, and the power sources and the ground signal(s) are supplied through the connected pad units 160. In addition, the first power source supplying line 250a for supplying the first power is electrically connected to the first power source line 150a for inputting the first power to the pixel unit 111 through the pad unit 160. The second power source supplying line 250b is electrically connected to the second power source line 150b for outputting the second power source from the pixel unit 111 through the pad unit 160. In addition, the power source supplying unit ground line 222 and the circuit unit ground line 121 for outputting the ground signal of the driving integrated circuit unit 115 are electrically grounded in common to be electrically connected to the ground ring 120. That is, the ground ring 120 receives the digital ground signals from the power source supplying unit ground line 222 and receives analog ground signals from the circuit unit ground line 121 to simultaneously or currently use the digital ground signals and the analog ground signals at the same (or substantially the same) time.

Here, the organic light emitting display 100 and the FPCs 200 are attached to each other using anisotropic conductive film (ACF). The organic light emitting display 100 and the FPCs 200 are attached to each other using the ACF between the driving integrated circuit unit 115 and the substrate 110. Therefore, the organic light emitting display 100 and the FPCs 200 connected to the pad units 160 are attached to each other. Also, the ESD generated by the mother substrate wiring line 130 is discharged in the order of the mother substrate wiring line 130, the ground ring 120, and the FPCs 200 to protect the circuits from (or reduce) the generation of the ESD.

Figure 3:
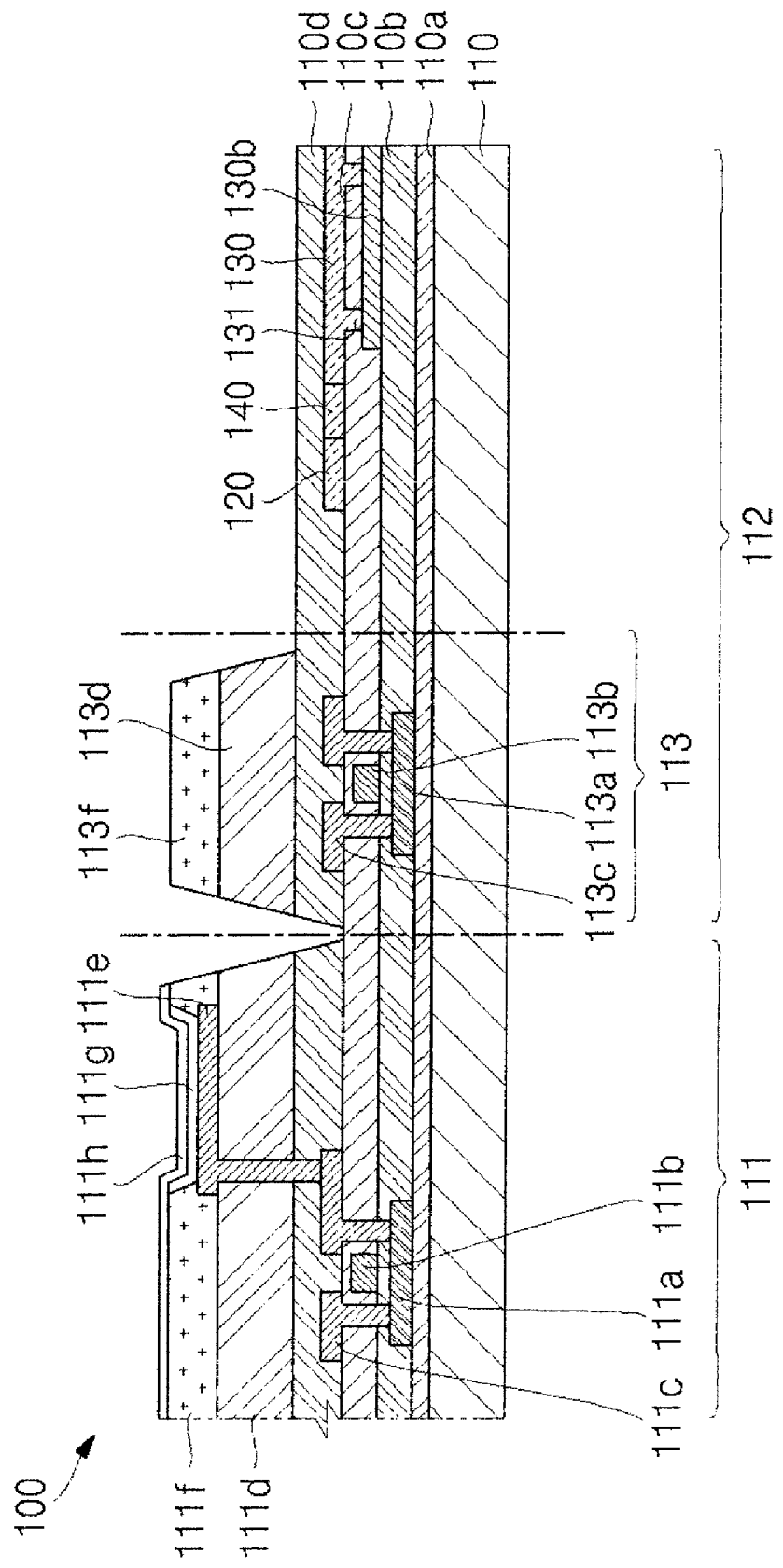
FIG. 3 is a sectional view taken along the line A-A' of FIG. 1.

FIG. 3 is a sectional view illustrating the organic light emitting display according to an embodiment of the present invention.

Referring to FIG. 3, the organic light emitting display 100 according to an embodiment of the present invention includes the pixel unit 111 and the non-pixel unit 112, and the pixel unit 111 and the non-pixel unit 112 are formed on the same substrate 110. Here, the non-pixel unit 112 includes the scan driving unit (or scan driver) 113 included in at least one driver, the ground ring 120, the mother substrate wiring line 130, and the connection wiring line 140 for connecting the ground ring 120 and the mother substrate wiring line 130 to each other.

The pixel unit 111 and the non-pixel unit 112 include a buffer layer 110a formed on the same substrate 110, active layers 111a and 113a formed on the buffer layer 110a, gate insulation layers 110b formed on the active layers 111a and 113a, gate electrodes 111b, 113b, and 130b formed on the gate insulation layers 110b, interlayer insulation layers 110c formed on the gate electrodes 111b, 113b, and 130b, source/drain electrodes 111c and 113c formed on the gate electrodes 111b, 113b, and 130b and the interlayer insulation layers 110c, the ground ring 120 and the mother substrate wiring line 130, the connection wiring line 140 for connecting the ground ring 120 and the mother substrate wiring line 130 to each other, protecting layers 110d formed on the source/drain electrodes 111c and 113c, the ground ring 120, the mother substrate wiring line 130, planarizing layers 111d and 113d formed on the protecting layers 110d, an anode electrode 111e formed on the planarizing layers 111d and 113d, pixel defining layers 111f and 113f formed on the external circumference of the anode electrode 111e, an organic thin film 111g formed on the anode electrode 111e, and a cathode electrode 111h formed on the organic thin film 111g.

The substrate 110 is formed with the pixel unit 111 and the non-pixel unit 112 that includes the regions excluding the pixel unit 111. The substrate 110 can be formed of a glass substrate, a plastic substrate, a metal substrate, a polymer substrate, or an equivalent thereof. However, the substrate according to the present invention is not limited to the above substrate materials.

Here, the buffer layer 110a is formed on the substrate 100. The buffer layer 110a prevents (or reduces) moisture $H_2O$, hydrogen $H_2$, or oxygen $O_2$ from penetrating into the active layers 111a and 113a or the organic thin film 111g to be described hereinafter. The buffer layer 110a can be formed of a silicon oxide layer $SiO_2$, a silicon nitride layer $Si_3N_4$, an inorganic layer, or an equivalent thereof. However, the buffer layer according to the present invention is not limited to the above materials. In addition, the buffer layer 110a can be omitted in accordance with the structure of the substrate 110 or the active layers 111a and 113a.

Also, the active layers 111a and 113a are formed on the buffer layer 110a. The active layers 111a and 113a can be composed of the source/drain regions formed at lateral sides of the active layers 111a and 113a to face each other and channel regions formed between the source/drain regions. The active layers 111a and 113a can be formed of amorphous silicon (Si), poly Si, an organic thin film, micro Si (silicon having a grain size between the amorphous Si and the poly Si), or equivalents thereof. However, the materials of the active layers 111a and 113a of the present invention are not limited to the above. In addition, when the active layers 111a and 113a are formed of the poly Si, the active layers 111a and 113a can be formed by a method of crystallizing the poly Si using a laser at a low temperature, a method of crystallizing the poly Si using a metal catalyst, or equivalents thereof. However, the method of crystallizing the poly Si of the present invention is not limited to the above methods.

The gate insulation layers 110b can be formed on the active layers 111a and 113a. The gate insulation layers 110b can be also formed on the buffer layer that is the external circumferences of the active layers 111a and 113a. In addition, the gate insulation layers 110b can be formed of a Si oxide layer, a Si nitride layer, an inorganic layer, or equivalents thereof. The materials of the gate insulation layers 110b of the present invention are not limited to the above.

The gate electrodes 111b, 113b, and 130b can be formed on the gate insulation layers 110b corresponding to the channel regions among the active layers 111a and 113a. The gate electrodes 111b, 113b, and 130b have a field effect transistor (FET) structure in which an electric field is applied to the channel regions under the gate insulation layers 110b so that the channels of holes or electrons are formed in the channel regions. In addition, the gate electrodes 111b, 113b, and 130b can be formed of the poly Si doped by metals (Mo, MoW, Ti, Cu, Al, AlNd, Cr, an Mo alloy, a Cu alloy, and an Al alloy) or equivalents thereof. However, the materials of the gate electrodes 111b, 113b, and 130b are not limited to the above.

The interlayer insulation layers 110c can be formed on the gate insulation layers 110b and the gate electrodes 111b, 113b, and 130b. The interlayer insulation layers 110c can be formed of a Si oxide layer, a Si nitride layer, polymer, plastic, glass, or equivalents thereof. However, the materials of the interlayer insulation layers 110c are not limited to the above. Regions (or predetermined regions) of the interlayer insulation layers 110c and the gate insulation layers 110b are etched to form contact holes that expose parts of the active layers 111a and 113a.

The source/drain electrodes 111c and 113c are formed on the interlayer insulation layers 110c by a plasma enhanced chemical vapor deposition (PECVD) method, a low pressure chemical vapor deposition (LPCVD) method, a sputtering method, or equivalents thereof. The source/drain electrodes 111c and 113c are formed in desired positions through a photoresist application process, an exposure process, a development process, an etching process, and/or a photo resist separation process after the above process. Conductive contacts that penetrate the interlayer insulation layers 110c are formed between the source/drain electrodes 111c and 113c and the source/drain regions of the active layers 111a and 113a. The conductive contacts are formed through the previously formed contact holes. Here, the ground ring 120 and the mother substrate wiring line 130 are formed in the same layer as the source/drain electrodes 111c and 113c.

The ground ring 120 and the mother substrate wiring line 130 are formed on the interlayer insulation layers 110c of the non-pixel unit 112, in the same layer as the source/drain electrodes 111c and 113c, and of substantially the same material as the source/drain electrodes 111c and 113c.

The ground ring 120 is formed in the non-pixel unit 112, at the external circumference of the pixel unit 111, and on the interlayer insulation layers 110c. All the ground signals can be connected to the ground ring 120 by circuit patterns. As a result, all the ground signals flow to the ground ring 120. However, the mother substrate wiring lines 130 are inserted into the ground ring 120 when the mother substrate is inspected in order to determine whether the pixels are defective so that the space of the external region where the ground ring 120 is provided is reduced and that the width of the ground ring 120 is reduced. Reduction in the width of the ground ring 120 can cause the generation of the static electricity. Therefore, the width of the ground ring 120 is increased using the mother substrate wiring line 130 to reduce the generation of the static electricity.

The mother substrate wiring line 130 is formed in the non-pixel unit 112, on the external circumference of the pixel unit 111, and on the interlayer insulation layers 110c where the gate electrodes 111b, 113b, and 130b are laminated. Here, conductive contacts are formed between the gate electrode 130b and the mother substrate wiring line 130 through contact holes 131 that penetrate the interlayer insulation layers 110c. In addition, one side of the mother substrate wiring line 130 is exposed to the interlayer insulation layers 110c and the protecting layers 110d. The mother substrate wiring line 130 is inserted when the mother substrate is inspected, that is, before the mother substrate is scribed to be separated from each other in order to test the organic light emitting display. Also, since the mother substrate wiring line 130 is floated after being scribed in units of cells, the charge cannot be discharged to the external power source or ground so that the ESD may not be smoothly generated.

As described above, the mother substrate wiring line 130 can be formed in the same layer as the ground ring 120 and the mother substrate wiring line 130 and of the same material as the ground ring 120 and the mother substrate wiring line 130. The mother substrate wiring line 130 is electrically connected to the ground ring 120 using the connection wiring line 140 to prevent (or protect) the pixels and driving units from being damaged by the ESD. Here, the mother substrate wiring line 130 can include a plurality of wiring lines. However, the mother substrate wiring line according to the present invention is not limited to the above. Also, as described above, the mother substrate wiring line 130 can be electrically connected to the ground ring 120 in order to prevent (or reduce) the static electricity from being received after the mother substrate wiring line is scribed. Therefore, the connection wiring line 140 for electrically connecting the ground ring 120 and the mother substrate wiring line 130 to each other can be formed in the organic light emitting display 100.

The connection wiring line 140 is formed in order to connect the ground ring 120 and the mother substrate wiring line 130 to each other. That is, the ground ring 120, the mother substrate wiring line 130, and the connection wiring line 140 can be formed in the same layer and of the same material. Therefore, the connection wiring line 140 is electrically connected between the ground ring 120 and the mother substrate wiring line 130 so that the width of the ground ring 120 is increased to improve the reliability of the ESD.

The protecting layers 110d are formed on the interlayer insulation layers 110c, the source/drain electrodes 111c and 113c, the ground ring 120, and the mother substrate wiring line 130 to protect the source/drain electrodes 111c and 113c. The protecting layers 110c can be formed of a common inorganic layer or an equivalent thereof. However, the protecting layers according to the present invention are not limited to the above.

The planarizing layers 111d and 113d are formed on the protecting layers 110d. The planarizing layers 111d and 113d prevent (or protect) the organic thin film 111g and the cathode electrode 111h thereof from being shorted due to a step difference and can be formed of benzocyclo butane (BCB), acryl, or equivalents thereof. However, the materials of the planarizing layers of the present invention are not limited to the above. After the planarizing layers 111d and 113d are formed, the region corresponding to the source/drain electrode 111c is etched to a form via hole in the protecting layer 110d and the planarizing layer 111d.

The anode electrode 111e can be formed of indium tin oxide (ITO), ITO/Ag, ITO/Ag, ITO/Ag/ITO, ITO/Ag/indium zinc oxide (IZO), an Ag alloy (ITO/Ag alloy/ITO), or equivalents thereof. However, the anode electrode of the present invention is not limited to the above. The ITO is a transparent conductive layer having a uniform work function so that hole injection barriers for the organic light emitting thin film are small. The Ag is a layer that reflects the light emitted from the organic light emitting thin film to the top surface in a top emission type. A conducting via that penetrates the protecting layers 110d and the planarizing layers 111d is formed between the source/drain electrode 111c and the anode electrode 111e. The conductive via electrically connects the anode electrode 111e and the source/drain electrode 111c to each other. In addition, the anode electrode 111e can be formed in the region excluding the region having the transistor structure, that is, the light emitting unit in order to maximize the aperture ratio.

The pixel defining layers 111f and 113f can be formed on the top surfaces of the planarizing layers 111d and 113d and the external circumference of the anode electrode 111e. In addition, the pixel defining layers 111f and 113f are formed in the region corresponding to the transistor structure, that is, the non-emitting unit in order to improve the aperture ratio of the pixels. The pixel defining layers 111f and 113f clearly distinguish the boundaries between the OLEDs to clarify the emission boundaries between the pixels. The pixel defining layers 111f and 113f can be formed of polyimide or equivalents thereof. However, the materials of the pixel defining layers of the present invention are not limited to the above.

The organic thin film 111g can be formed on the anode electrode 111e and the pixel defining layers 111f and 113f. The organic thin film 111g includes a hole injection layer, a hole transport layer, a light emitting layer, an electron transport layer, and an electron injection layer. The organic thin film 111g excluding the light emitting layer is formed through the entire surface of the organic light emitting display. The light emitting layer is formed in the light emitting region to correspond to the anode electrode 111e, by a laser induced thermal imaging (LITI) method, and using a fine metal mask (FMM). Finally, the cathode electrode 111h formed on the electron injection layer and/or on the entire substrate of the organic light emitting display is included.

Figure 4:
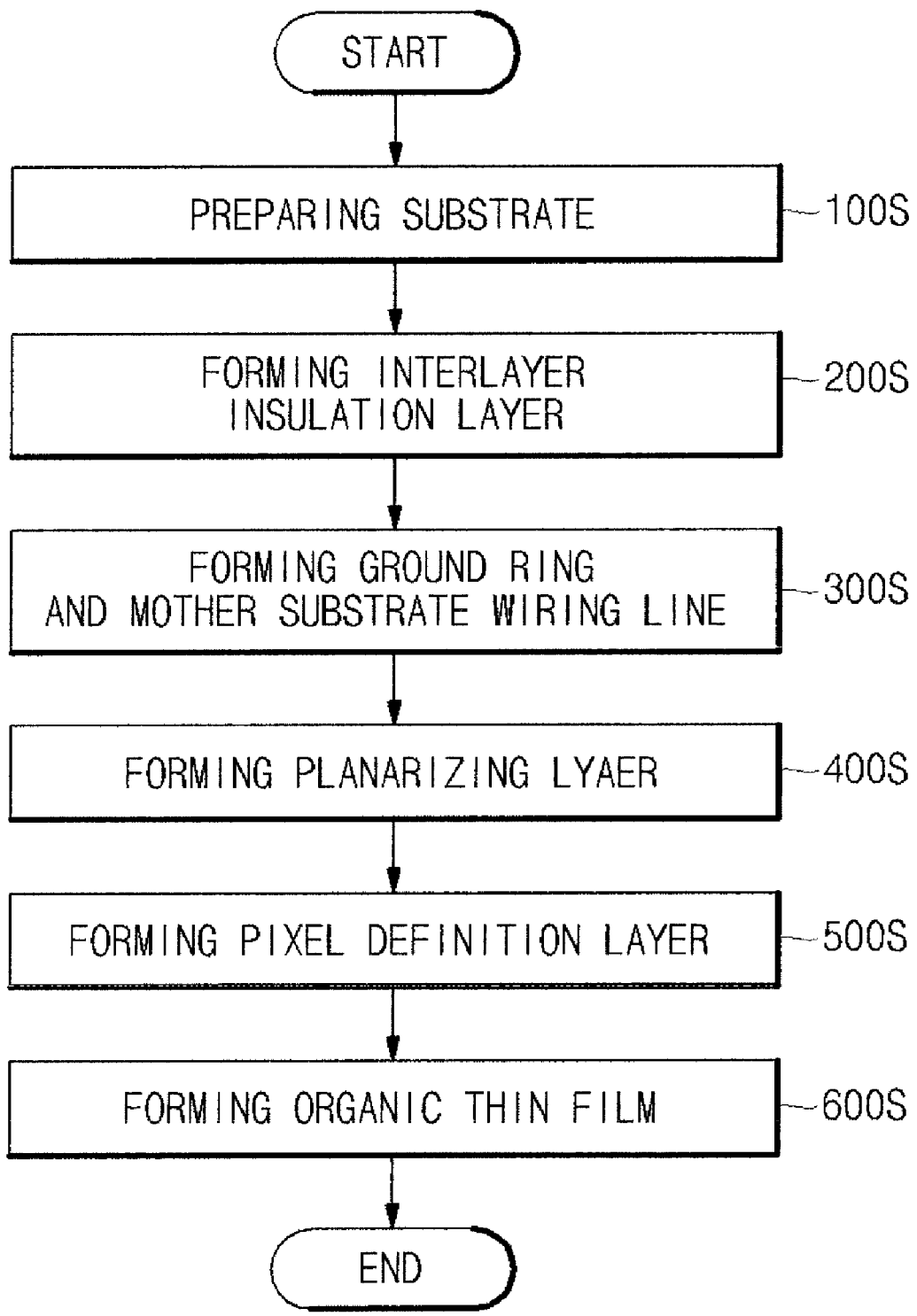
FIG. 4 is a flowchart illustrating a method of manufacturing an organic light emitting display according to an embodiment of the present invention.

FIG. 4 is a flowchart illustrating a method of manufacturing an organic light emitting display according to an embodiment of the present invention.

Referring to FIG. 4, the method of manufacturing the organic light emitting display according to the embodiment of the present invention includes a substrate preparing step (100S), an interlayer insulating layer forming step (200S), a ground ring and mother substrate wiring line forming step (300S), a planarizing film forming step (400S), a pixel definition layer forming step (500S), and an organic thin film forming step (600S).

Hereinafter, the method of manufacturing an organic light emitting display according to an embodiment of the present invention will be described in detail with reference to other drawings.

FIGS. 5a to 5f are sectional views of parts of the organic light emitting display illustrating the method of manufacturing the organic light emitting display according to the flow chart FIG. 4.

Referring to FIG. 5a, the substrate preparing step 100S includes a sub-step of forming the pixel unit 111 at (or in) the center region of the substrate 110 and the non-pixel unit 112 at the external circumference of the pixel unit 111. Also, the substrate preparing step 100S further includes a sub-step of forming the buffer layer 110a on the substrate 110 on which the pixel unit 111 and the non-pixel unit 112 are formed, of forming the active layers 111a and 113a on the buffer layer 110a, and of forming the gate insulation layer 110b on the active layers 111a and 113a.

The substrate 110 is formed with the pixel unit 111 and the non-pixel unit 112 formed in the whole region of the substrate 110 except for the pixel unit 111. The substrate 110 may be made of a material selected from a suitable glass substrate, a plastic substrate, a metal substrate, a polymer substrate, and an equivalent thereof, but the present invention are not limited to these materials.

The buffer layer 110a may be formed on the upper side of the substrate 110. The buffer layer 110a prevents (or reduces) moisture $H_2O$, hydrogen $H_2$, oxygen $O_2$ from penetrating the substrate toward the active layers 111a and 113a and an organic thin film 111g to be described later. To this end, the buffer layer 110a may be made of a material selected from silicone dioxide film ($SiO_2$), silicone nitride ($Si_3N_4$), an inorganic film, and an equivalent thereof, but is not limited to these materials. In addition, the buffer layer 110a may be omitted according to structures of the substrate 110 or the active layers 111a and 113a.

As shown in FIG. 5a, the active layers 111a and 113a are formed on the buffer layer 110a. The active layers 111a and 113a may be composed of source/drain regions that are formed at lateral sides of the active layers 111a and 113a to face each other and a channel region formed between and the source/drain regions. These active layers 111a and 113a may be made of a material selected from amorphous silicone, polycrystalline silicone, an organic thin film, micro-silicone (silicone having grain size between the amorphous silicone and the polycrystalline silicone), and the equivalent thereof, but kinds of the active layers 111a and 113a are not limited to these materials. Moreover, when the active layers 111a and 113a are made of the polycrystalline silicone, the active layers 111a and 113a may be formed by any one of a method of crystallizing using laser at a low temperature, a method of crystallizing using metallic catalyst, and an equivalent thereof, but the method of forming the active layers is not limited to the method of crystallizing the polycrystalline silicone.

The gate insulation layer 110b may be formed on the active layers 111a and 113a. Also, the gate insulation layer 110b may also be formed on the buffer layer 110a and the active layers 111a and 113a. The gate insulation layer 110b may be made of a material selected from a silicone dioxide layer, the silicone nitride, the inorganic layer, or the equivalent thereof, which are easily obtained during a semiconductor process, but here, material of the gate insulation layer 110a is not limited.

Referring to FIG. 5b, the interlayer insulation layer forming step (200S) includes a sub-step of forming the gate electrodes 111b, 113b, and 130b on the gate insulation layer 110b and of forming the interlayer insulation layer 110c on the gate electrodes 111b, 113b, and 130b.

The gate electrodes 111b, 113b, and 130b may be formed on the gate insulation layer 110b corresponding to the channel region of the active layers 111a and 113a. The gate electrodes 111b, 113b, and 130b have field effect transistor (FET) structures in which an electric field is applied to the channel regions lower than the gate insulation layer 110b so that a hole channel or an electron channel is formed in the channel regions. The gate electrodes 111b, 113b, and 130b are made of a material selected from polycrystalline silicone doped with metals such as Mo, MoW, Ti, Cu, Al, AlNd, Cr, Mo alloy, Cu alloy, Al alloy, and equivalents thereof, but here, material of the gate electrodes is not limited.

The interlayer insulation layer 110c may be formed on the gate insulation layer 110b and the gate electrodes 111b, 113b, and 130b. The interlayer insulation layer 110c may be made of any one selected from silicone dioxide layer, silicone nitride layer, polymer, plastic, glass, and equivalents thereof, but here material of the interlayer insulation layer 110c is not thereby limited. Predetermined regions of the interlayer insulation layer 110c and the gate insulation layer 110b are etched to form contact holes for exposing parts of the active layers 111a and 113a.

Figure 5C:
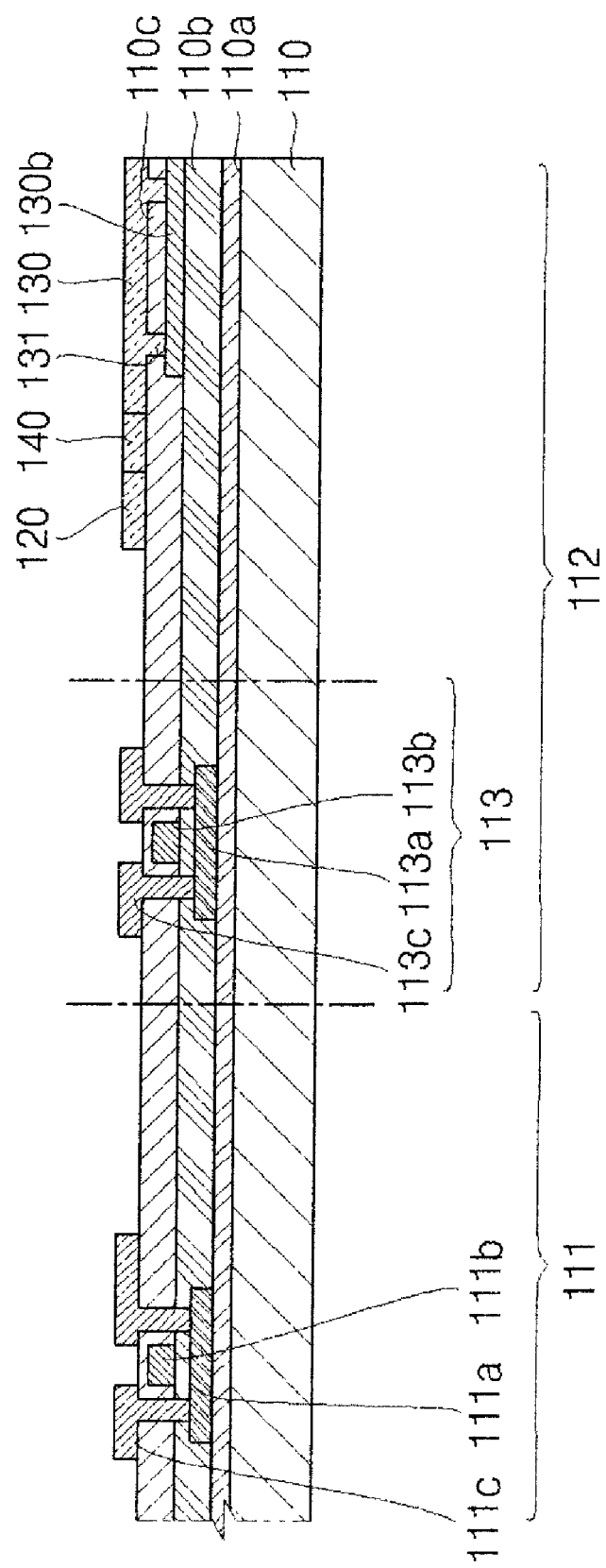

Referring to FIG. 5c, the ground ring and mother substrate wiring line forming step (300S) includes a sub-step of forming the source/drain electrodes 111c and 113c on the interlayer insulation layer 110c and forming the ground ring 120 and the mother substrate wiring line 130 on the same layer on which the source/drain electrodes 111c and 113c are formed.

The source/drain electrodes 111c, 113c are formed on the interlayer insulation layer 110c by any one of plasma enhanced chemical vapor deposition (PECVD), low pressure chemical vapor deposition (LPCVD), sputtering, and an equivalent thereof. After the above-mentioned process, the source/drain electrodes 111c and 113c are formed at desired positions by processes of photoresist coating, lithography, developing, etching, and/or photoresist separation. Between the source/drain electrodes 111c and 113c and the source/drain regions of the active layers 111a and 113a, conductive contacts for penetrating the interlayer insulation layer 110c are formed. The conductive contacts are formed through previously formed contact holes.

Also, the non-pixel unit 112 is formed at the external circumference of the pixel unit 111 by any one selected from PECVD, LPCVD, LPCVD, sputtering, and an equivalent thereof. After the above-mentioned process, the source/drain electrodes 111c and 113c are formed at desires positions by processes of photoresist coating, lithography, developing, etching, and photoresist separation. Between the source/drain electrodes 111c and 113c and the source/drain regions of the active layers 111a and 113a, conductive contacts for penetrating the interlayer insulation layer 110c are formed. The conductive contacts are formed through previously formed contact holes.

Also, the ground ring 120 and the mother substrate wiring line 130 are formed on the same layer as a layer at the edge of the pixel unit 111 and in which the source/drain electrodes 111c and 113c are formed.

The ground ring 120 is at the external circumference of the pixel unit 111 and is formed in the non-pixel unit 112 and on the interlayer insulation layer 110c. The ground ring 120 may be connected to every ground signal by a circuit pattern. Therefore, every ground signal flows toward the ground ring 120. However, since an outer space, where the ground ring 120 is disposed, becomes narrow when the mother substrate wiring line 130 is inserted during the mother substrate inspection for inspecting whether pixels are defective or not, a width of the ground ring 120 becomes small. The decrease of the width of the ground ring 120 may cause static electricity to occur. In the present embodiment, the width of the ground ring 120 is increased using the mother substrate wiring line 130 so that the static electricity can be reduced.

The mother substrate wiring line 130 is electrically connected to the ground ring 120 via the connection wiring line 140. The mother substrate wiring line 130 is formed in the non-pixel unit 112 and on the same layer as those of the source/drain electrodes 111c and 113c and the ground ring 120 with the same material as those of the source/drain electrodes 111c and 113c and the ground ring 120. In this case, the mother substrate wiring line 130 is electrically connected to the gate electrode 130b by the contact hole 131 for forming the conductive contact penetrating the interlayer insulation layer 110c. Since there is a risk of ESD between the ground ring 120 and the mother substrate wiring line 130 after scribing and cutting to float the mother substrate wiring line 130, the mother substrate wiring line 130, according to an embodiment of the present invention, is electrically connected to the ground ring 120.

As such, the organic light emitting display 100 further includes the connection wiring line 140 for electrically connecting the ground ring 120 and the mother substrate wiring line 130 to each other. Here, the connection wiring line 140 may be formed in the same layers with the same material as the ground ring 120 and the mother substrate wiring line 130. Therefore, the ground ring 120 is electrically connected to the mother substrate wiring line 130 so that the width of the ground ring 120 can be increased to improve reliability for ESD.

Referring to FIG. 5d, the planarizing layer forming step (400S) includes a sub-step of sequentially forming the protecting layer 110d on the source/drain electrodes 111c and 113c, the ground ring 120, and the mother substrate wiring line 130, and forming the planarizing layers 111d and 113d on the protecting layer 110d.

The protecting layer 110d is formed on the interlayer insulation layer 110c and the source/drain electrodes 111c and 113c and on the ground ring 120 and the mother substrate wiring line 130, and protects the source/drain electrodes 111c and 113c. The protecting layer 110d may be formed of a material selected from a suitable inorganic layer and an equivalent thereof, but is not limited to these materials.

The planarizing layers 111d and 113d are formed on the protecting layer 110d. These planarizing layers 111d and 113d prevent (or protect) the organic thin film 111g that will be described later and the cathode electrode 111h thereof from being shorted or broken due to a process step, and may be formed of a material selected from benzo cyclo butene (BCB), acrylic, and an equivalent thereof, but is not limited to these materials. After forming the planarizing layers 111d and 113d, regions corresponding to the source/drain electrodes 111c and 113c are etched to form via-holes in the planarizing layers 111d and 113d.

Figure 5E:
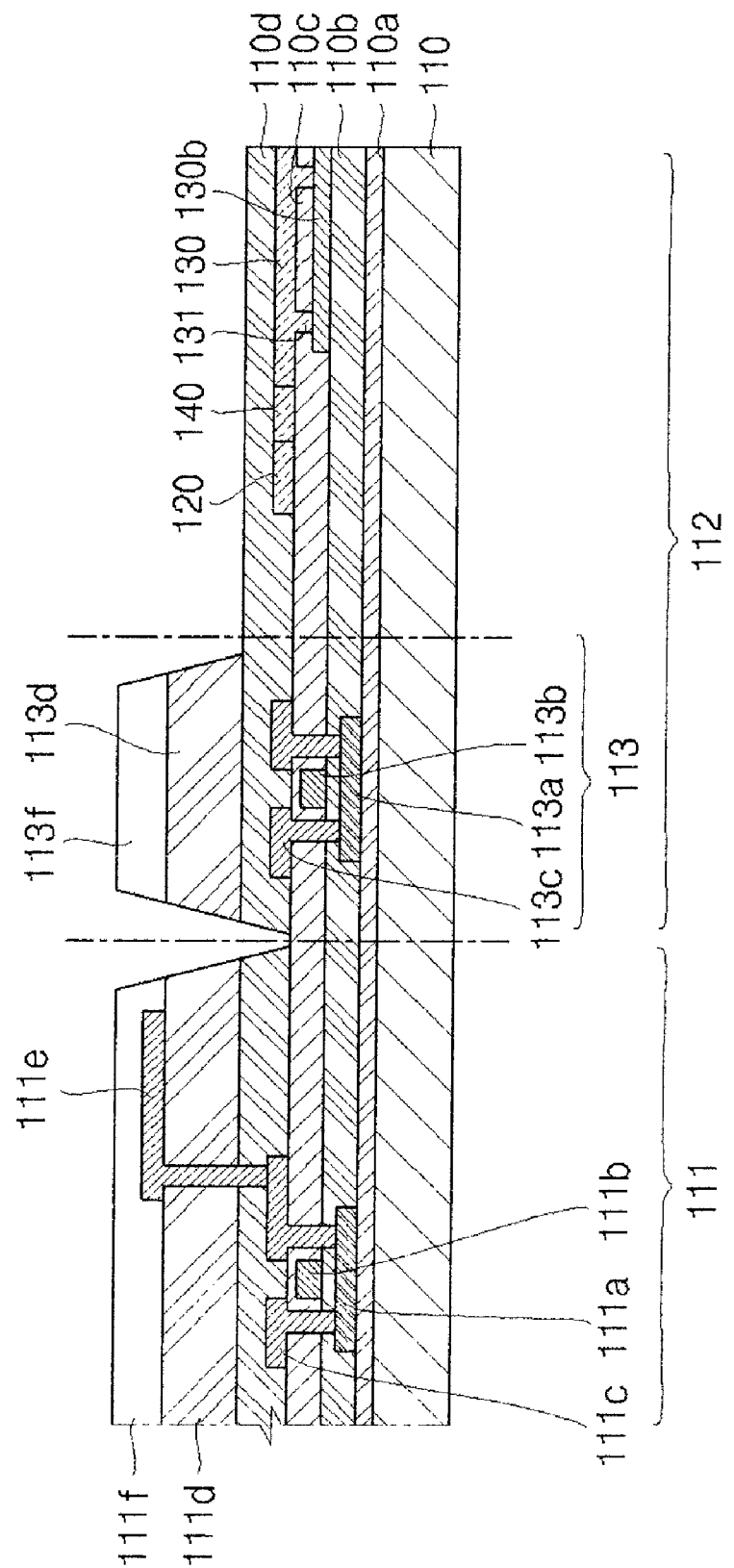

Referring to FIG. 5e, the pixel definition layer forming step (500S) includes a sub-step of forming the anode electrode 111e on the planarizing layers 111d and 113d and forming the pixel definition layers 111f and 113f on the external circumference of the anode electrode 111e.

The anode electrode 111e may be made of a material selected from indium tin oxide (ITO), ITO/Ag, ITO/Ag/ITO, ITO/Ag/indium zinc oxide (IZO), silver alloy (ITP/Ag alloy/ITO), and an equivalent thereof, but material of the anode electrode 111e is not limited in the present invention. The ITO is a transparent conductive layer having uniform work function and a small hole injection barrier with respect to an organic electric field light emitting thin film, and the Ag is a layer for reflecting light from the organic electric field light emitting thin film upwardly in a top emission type. The conductive via for penetrating the protecting layer 110d and the planarizing layer 111d is formed between the source/drain electrode 111c and the anode electrode 111e. The conductive via electrically connects the anode electrode 111e to the source/drain electrode 111c. Also, the anode electrode 111e may be formed in the region except for the region corresponding to a transistor structure, i.e., in a light emitting portion of the light emitting unit 111 in order to maximize aperture ratio.

The pixel definition layers 111f and 113f may be formed on the planarizing layers 111d and 113d and on the external circumference of the anode electrode 111e. Also, the pixel definition layers 111f and 113f, in order to increase aperture ration of pixels, are formed in the region corresponding to the transistor structure, i.e., in an non-emitting portion of the light unit 111. The pixel definition layers 111f and 113f clearly distinguish boundary between the respective organic light emitting display devices so that light emitting boundary regions between the pixels are clear. The pixel definition layers 111f and 113f may be formed of a material selected from polyimide and an equivalent thereof, but material of the pixel definition layers 111f and 113f is not limited.

Figure 5F:
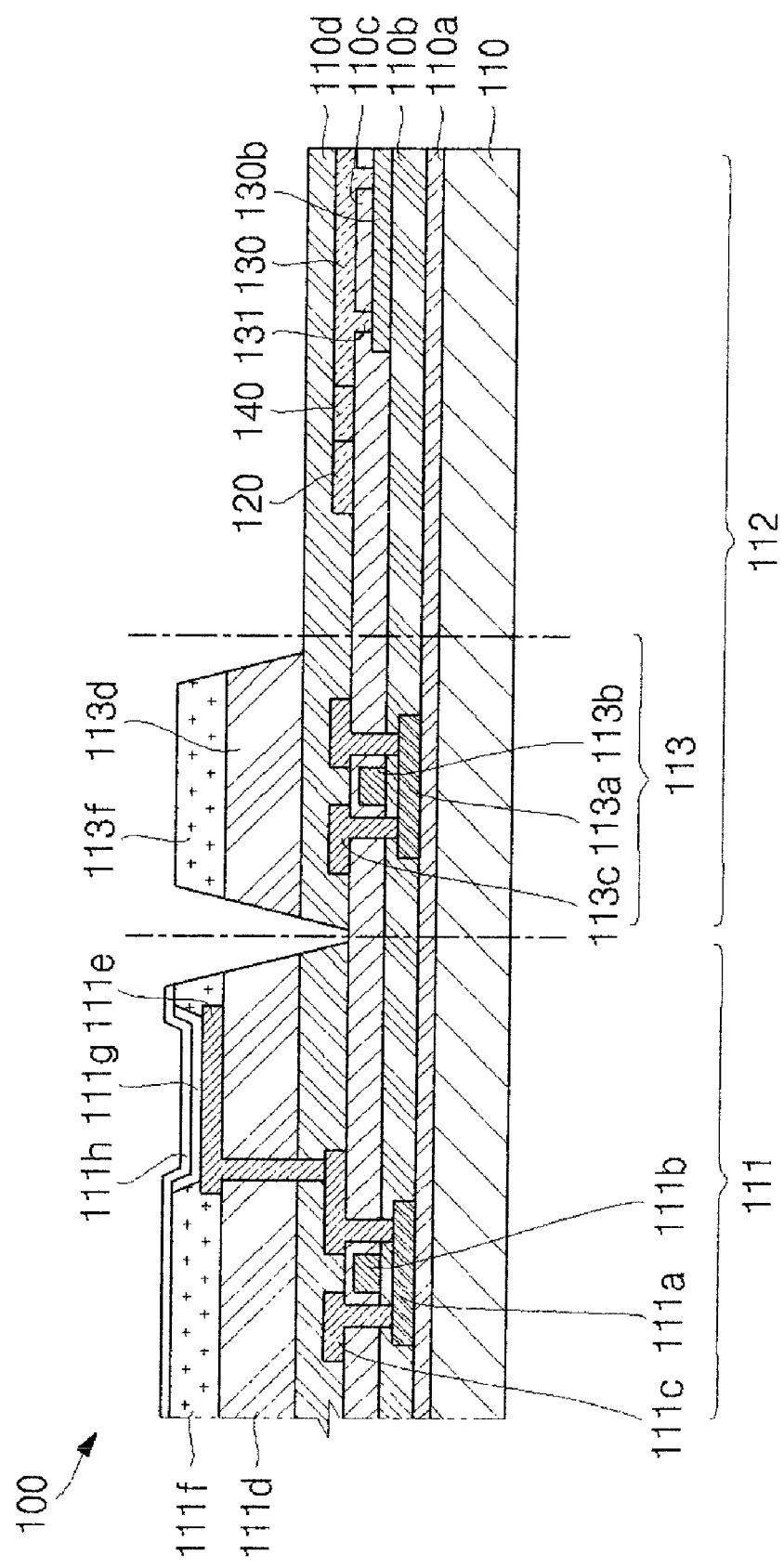

Referring to FIG. 5f, the organic thin film 111g may be formed on the anode electrode 111e and the pixel definition layers 111f and 113f. The organic thin film 111g includes a hole injecting layer, a hole transfer layer, a light emitting layer, an electron transfer layer, and an electron injecting layer. The organic thin film 111g except for the light emitting layer may be formed on the whole (or entire surface) of of the organic light emitting display. The light emitting layer is formed in the light emitting region using the FMM in the LITI method to correspond to the upper side where the anode electrode 111e is formed. Finally, the cathode electrode 111h is formed on the whole surface of the organic light emitting display.

As described above, according to embodiments of the present invention an organic light emitting display and a method of manufacturing the same, a ground ring is electrically connected to a mother substrate wiring line utilizing a connection wiring line during the inspection of a mother substrate so that pixels and driving units included in the organic light emitting display can be prevented (or protected) from being broken due to discharge of the static electricity.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   a substrate having a center region;
   a pixel unit on the substrate and at the center region of the substrate;
   a non-pixel unit on the substrate and at an external circumference of the pixel unit;
   a ground ring in the non-pixel unit;
   a mother substrate wiring line on the substrate and at the external circumference of the ground ring; and
   a connection wiring line for electrically connecting the ground ring and the mother substrate wiring line to each other,
   wherein a buffer layer and a gate insulation layer are sequentially on the substrate and in the non-pixel unit;
   a gate electrode is on the gate insulation layer; and
   an interlayer insulation layer is on the gate electrode to cover the gate electrode, and
   wherein the ground ring and the mother substrate wiring line are on the gate electrode and the interlayer insulation layer.

2. The organic light emitting display as claimed in claim 1, further comprising a protecting layer comprising $Si_3N_4$ on the ground ring and the mother substrate wiring line.

3. The organic light emitting display as claimed in claim 1, wherein the connection wiring line comprises a same material as those of the ground ring and the mother substrate wiring line and is on a same layer of the organic light emitting display as that of the ground ring and the mother substrate wiring line.

4. The organic light emitting display as claimed in claim 1, wherein the mother substrate wiring line is electrically connected to the gate electrode through a contact hole for forming a conductive contact.

5. The organic light emitting display as claimed in claim 1, further comprising a protecting layer, wherein the mother substrate wiring line has a side exposed to the outside of the interlayer insulation layer and the protecting layer.

6. The organic light emitting display as claimed in claim 5, wherein the protecting layer comprises $Si_3N_4$ on the ground ring and the mother substrate wiring line.

7. The organic light emitting display as claimed in claim 1, wherein the ground ring has a substantially square ring form to surround at least three sides of the pixel unit.

8. The organic light emitting display as claimed in claim 1, wherein the mother substrate wiring line is at one or more sides of an external circumference of the ground ring and extends in a column direction.

9. The organic light emitting display as claimed in claim 1, wherein the non-pixel unit comprises:
   a driving integrated circuit unit for driving pixels of the pixel unit; and
   a pad unit for electrically connecting the driving integrated circuit unit and the ground ring to an external module.

10. The organic light emitting display as claimed in claim 9, wherein the ground ring is electrically connected to a circuit unit ground line for outputting a ground signal of the driving integrated circuit unit.

11. The organic light emitting display as claimed in claim 9, wherein the pad unit is at one or more sides of an internal circumference of the substrate.

12. The organic light emitting display as claimed in claim 1, wherein the ground ring has ends electrically connected to a flexible printed circuit board.

13. The organic light emitting display as claimed in claim 12, wherein the flexible printed circuit board comprises:
   a power source supplying unit for supplying power to the pixel unit;
   a power source unit ground line for outputting a ground signal of the power source supplying unit; and
   a circuit unit ground line electrically connected to the ground ring.

14. A method of manufacturing an organic light emitting display comprising:
   preparing a substrate with a pixel unit formed at a center region of the substrate and a non-pixel unit formed at an external circumference of the pixel unit;
   forming a buffer layer on the substrate;
   forming a gate insulation layer on the buffer layer;
   forming a gate electrode on the gate insulation layer;
   forming an interlayer insulation layer on the gate electrode to cover the gate electrode;
   forming a ground ring and a mother substrate wiring line on the interlayer insulation layer and in the non-pixel unit; and
   forming a connection wiring line for electrically connecting the ground ring and the mother substrate wiring line to each other.

15. The method of manufacturing an organic light emitting display as claimed in claim 14, wherein the connection wiring line is made of a same material as those of the ground ring and the mother substrate wiring line and is formed on a same layer as those of the ground ring and the mother substrate wiring line.

16. The method of manufacturing an organic light emitting display as claimed in claim 14, wherein the mother substrate wiring line is connected to the gate electrode through a contact hole for forming a conductive contact.

17. The method of manufacturing an organic light emitting display as claimed in claim 14, wherein the forming of the ground ring and the mother substrate wiring line comprises forming a protecting layer comprising $Si_3N_4$ on the ground ring and the mother substrate wiring line.

18. The method of manufacturing an organic light emitting display as claimed in claim 14, wherein the preparing of the substrate comprises forming at least one driving unit for driving a pixel of the pixel unit to emit light in the non-pixel unit.

19. An organic light emitting display comprising:

a substrate;

a pixel unit on the substrate;

a non-pixel unit on the substrate and comprising a ground ring and a mother substrate wiring line; and a connection wiring line for electrically connecting the ground ring and the mother substrate wiring line and configured to increase a width of the ground ring for discharging static electricity to ground, wherein a buffer layer and a gate insulation layer are sequentially on the substrate and in the non-pixel unit;

a gate electrode is on the gate insulation layer; and an interlayer insulation layer is on the gate electrode to cover the gate electrode, and wherein the ground ring and the mother substrate wiring line are on the gate electrode and the interlayer insulation layer.

* * * * *